United States Patent
Nagata et al.

(10) Patent No.: US 9,380,195 B2
(45) Date of Patent: Jun. 28, 2016

(54) CAMERA MODULE

(71) Applicant: KABUSHIKI KAISHA TOSHIBA, Tokyo (JP)

(72) Inventors: Kazuhiro Nagata, Kanagawa (JP); Katsuo Iwata, Kanagawa (JP); Ninao Sato, Tokyo (JP); Takayuki Ogasahara, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 86 days.

(21) Appl. No.: 14/191,266

(22) Filed: Feb. 26, 2014

(65) Prior Publication Data
US 2015/0029369 A1  Jan. 29, 2015

(30) Foreign Application Priority Data

Jul. 25, 2013 (JP) ................................ 2013-154635

(51) Int. Cl.
*H04N 5/225* (2006.01)
*H01L 27/146* (2006.01)

(52) U.S. Cl.
CPC ........ *H04N 5/2257* (2013.01); *H01L 27/14618* (2013.01); *H01L 27/14625* (2013.01)

(58) Field of Classification Search
CPC ........... H04N 5/2257; H01L 27/14618; H01L 27/14625
USPC ........................ 348/222.1, 240, 307, 308, 360
See application file for complete search history.

(56) References Cited

U.S. PATENT DOCUMENTS

| 6,285,400 | B1 | 9/2001 | Hokari | |
|---|---|---|---|---|
| 7,675,016 | B2 | 3/2010 | Mochizuki et al. | |
| 8,174,612 | B1* | 5/2012 | Koehler | H04N 5/23238 248/292.12 |
| 8,982,270 | B2* | 3/2015 | Bowler | H01L 27/14601 250/208.1 |
| 2001/0040639 | A1* | 11/2001 | Iwasaki | H01L 27/14601 348/374 |
| 2005/0030408 | A1* | 2/2005 | Ito | H04N 5/2253 348/340 |
| 2006/0114344 | A1 | 6/2006 | Kyong et al. | |

FOREIGN PATENT DOCUMENTS

| JP | H10108078 A | 4/1998 |
|---|---|---|
| JP | 2001284564 A | 10/2001 |
| JP | 2004140426 A | 5/2004 |
| JP | 2008078598 A | 4/2008 |
| JP | 2009075271 A | 4/2009 |

(Continued)

OTHER PUBLICATIONS

KR Office Action dated Dec. 2, 2015 for Application No. 10-2014-0057729.

(Continued)

*Primary Examiner* — Hung Lam
(74) *Attorney, Agent, or Firm* — Patterson & Sheridan, LLP

(57) ABSTRACT

A camera module includes a solid-state image sensing device having a light receiving surface on which a plurality of pixels are provided, and a lens disposed above the solid-state image sensing device and configured to direct light into each of the pixels of the solid-state image sensing device. The lens includes at least one convex portion on a surface facing the light receiving surface of the solid-state image sensing device, and the light receiving surface of the solid-state image sensing device is curved so that chief rays of the light directed by the lens are incident on the respective pixels at substantially the same angles.

18 Claims, 3 Drawing Sheets

(56) References Cited

FOREIGN PATENT DOCUMENTS

| | | | |
|---|---|---|---|
| TW | 200522730 | A | 7/2005 |
| TW | 201112407 | A | 4/2011 |

OTHER PUBLICATIONS

Taiwan Office Action dated Feb. 17, 2016, filed in Taiwan counterpart Application No. 103112282, 10 pages (with translation).

\* cited by examiner

CAMERA MODULE

CROSS-REFERENCE TO RELATED APPLICATION

This application is based upon and claims the benefit of priority from Japanese Patent Application No. 2013-154635, filed Jul. 25, 2013, the entire contents of which are incorporated herein by reference.

FIELD

Embodiments described herein relate generally to a camera module.

BACKGROUND

A small camera module mounted on, for example, a mobile telephone is such that a solid-state image sensing device having a light receiving surface on which a plurality of pixels is arranged in a grid-like pattern is covered with a lens holder which holds a lens.

In this type of camera module, heretofore, the solid-state image sensing device in the lens holder has a light receiving surface that is horizontal. However, when a lens whose surface facing the light receiving surface of the solid-state image sensing device is, for example, convexly curved, light is vertically incident on a pixel in the central portion, but obliquely incident on a pixel at an end portion. Consequently, in the heretofore known camera module, there is a problem in that sensitivity varies from pixel to pixel.

DETAILED DESCRIPTION

An example embodiment has an object of providing a camera module in which it is possible to reduce the variation in sensitivity from pixel to pixel.

In general, according to one embodiment, a camera module include a solid-state image sensing device having a light receiving surface on which a plurality of pixels are provided, and a lens disposed above the solid-state image sensing device and configured to direct light into each of the pixels of the solid-state image sensing device. The lens includes at least one convex portion on a surface facing the light receiving surface of the solid-state image sensing device, and the light receiving surface of the solid-state image sensing device is curved so that chief rays of the light directed by the lens are incident on the respective pixels at substantially the same angles.

Figure 1:
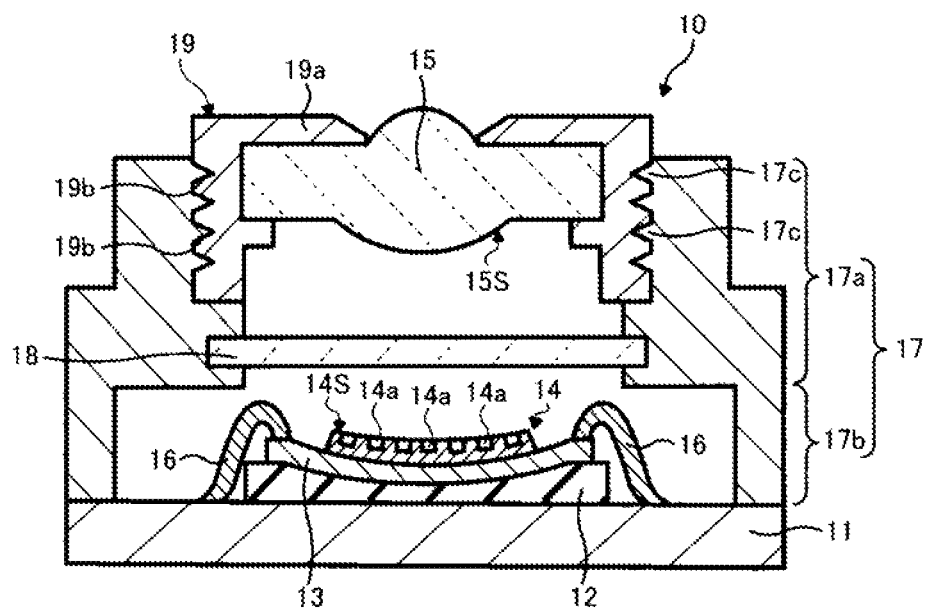
FIG. 1 is a sectional view depicting a camera module according to an embodiment.

Hereafter, a description is given of the camera module according to the embodiment. FIG. 1 is a sectional view showing the camera module according to the embodiment. In a camera module 10 shown in FIG. 1, a solid-state image sensing device 14 is disposed on a first substrate 11 via a spacer 12 and a second substrate 13.

The spacer 12 has a curved front surface for curving a light receiving surface 14S of the solid-state image sensing device 14 in accordance with the shape of a lens 15, to be described hereafter. The spacer 12, being, for example, a resin molding, is disposed on the front surface of the first substrate 11.

The second substrate 13 formed from a semiconductor such as silicon is disposed on the curved front surface of the spacer 12. The second substrate 13, on the front surface of which is disposed the solid-state image sensing device 14, is disposed so that the whole of the rear surface of the second substrate 13 is in contact with the front surface of the spacer 12. By being disposed in this way, the second substrate 13 is curved in accordance with the shape of the front surface of the spacer 12.

The solid-state image sensing device 14 is disposed on the front surface of the second substrate 13. The solid-state image sensing device 14, having the light receiving surface 14S on which a plurality of pixels 14a are arranged in a grid-like pattern, receives light using the pixels 14a, generates a quantity of charge corresponding to the amount of light received, and thereby generates a signal voltage. Since this type of solid-state image sensing device 14 is disposed on the curved front surface of the second substrate 13, the light receiving surface 14S of the solid-state image sensing device 14 is curved in accordance with the curved shape of the second substrate 13, that is, in accordance with the curved shape of the front surface of the spacer 12.

The solid-state image sensing device 14 and the second substrate 13 are electrically interconnected. Further, the second substrate 13 and the first substrate 11 are electrically connected by, for example, wires 16. Consequently, a signal output from the solid-state image sensing device 14 is transmitted to the first substrate 11 via the second substrate 13 and the wires 16.

A cylindrical lens holder 17 formed from, for example, a light-shielding resin is disposed on the front surface of the first substrate 11 on which the solid-state image sensing device 14 is disposed. The lens holder 17 includes a small diameter portion 17a small in inner diameter and a large diameter portion 17b larger in inner diameter than the small diameter portion 17a. This type of lens holder 17 is disposed on the front surface of the first substrate 11 so that the large diameter portion 17b covers the solid-state image sensing device 14, the second substrate 13, and the spacer 12, and so that the lens 15, to be described hereafter, is disposed above the solid-state image sensing device 14.

An infrared blocking filter 18, which blocks infrared components of light incident from the exterior of the camera module 10 and transmits components other than the infrared components, is disposed in one portion of the small diameter portion 17a of the lens holder 17.

A cylindrical lens barrel 19, at one end of which is provided a top portion 19a, formed from, for example, a light-shielding resin, which includes an opening portion in the center, is fitted in a portion, of the inner portion of the small diameter portion 17a of this type of lens holder 17, above the infrared blocking filter 18 so as to be movable vertically. Further, the lens 15 which transmits light into each pixel 14a of the solid-state image sensing device 14 is disposed in an inner portion of the cylindrical lens barrel 19.

A thread ridge 17c is provided in the small diameter portion 17a of the lens holder 17, and a thread groove 19b is provided in the outer peripheral surface of the lens barrel 19. Consequently, in the embodiment, it is possible to cause the lens barrel 19 to move vertically by turning the lens barrel 19. Movement of the lens barrel 19 adjusts the position vertically of the lens 15 disposed in the inner portion of the lens barrel 19.

In this type of camera module 10 according to the embodiment, a surface 15S of the lens 15 in the lens holder 17, opposite to the light receiving surface 14S of the solid-state image sensing device 14, is convexly curved. Hereafter, a description is given of how the surface 15S of the lens 15 emits light incident on this type of lens 15.

Figure 2:
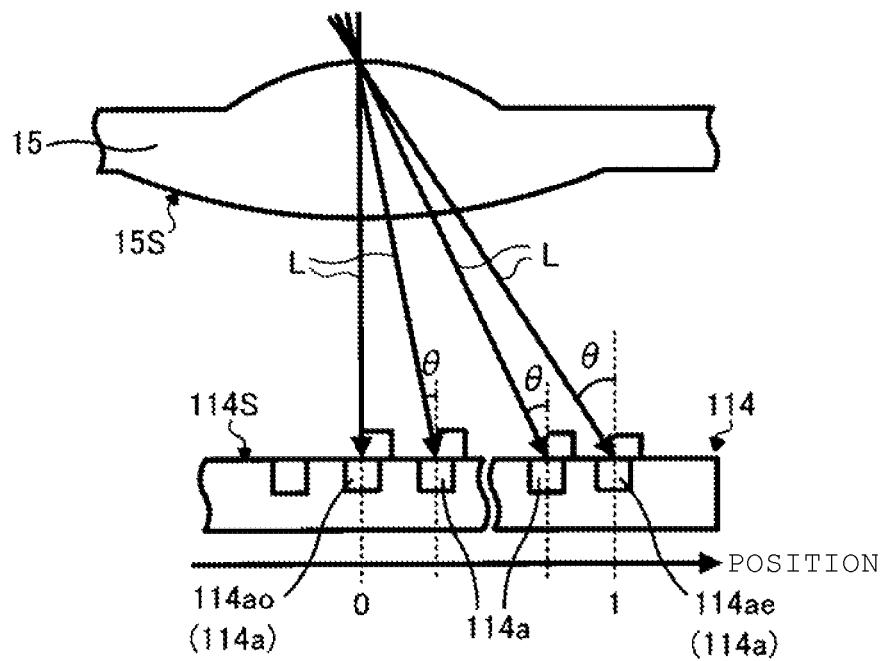
FIG. 2 is a diagram illustrating how light incident on a lens whose surface is convexly curved travels toward a solid-state image sensing device having a horizontal light receiving surface.

FIG. 2 is a diagram illustrating how light incident on the lens 15, whose surface 15S is convexly curved, travels toward a solid-state image sensing device 114 having a horizontal light receiving surface 114S on which a plurality of pixels 114a are arranged in a grid-like pattern. In FIG. 2, the position of a pixel 114a disposed on the extension of the optical axis of the lens 15 is taken to be "0", and the position of a pixel 114a disposed in a position farthest from the position "0" is taken to be "1" as a position relative to the pixel 114a in the position "0". Also, solid arrows L in FIG. 2 indicate chief rays of light emitted from the surface 15S of the lens 15. In the following description, the pixel 114a disposed in the position "0" is called a pixel 114ao in the central portion, and the pixel 114a disposed in the position "1" is called a pixel 114ae in the extreme end portion.

As shown in FIG. 2, light incident on the pixel 114ao reaches the pixel 114ao such that the chief ray L of the light is incident substantially vertically to the front surface of the pixel 114ao. That is, the heretofore described horizontal light receiving surface 114S means a light receiving surface is substantially vertical to the chief ray L of light incident on the pixel 114ao in the central portion.

However, light incident on the pixels 114a including the pixel 114ae in the extreme end portion and excluding the pixel 114ao in the central portion reaches each pixel 114a such that the chief rays L of the light are incident in an oblique direction with respect to the surfaces of the pixels 114a.

That is, the pixel 114ao in the central portion receives light at a chief ray angle θ=0°, while the pixels 114a including the pixel 114ae in the extreme end portion and excluding the pixel 114ao in the central portion receive light at chief ray angles θ=0°.

Figure 3:
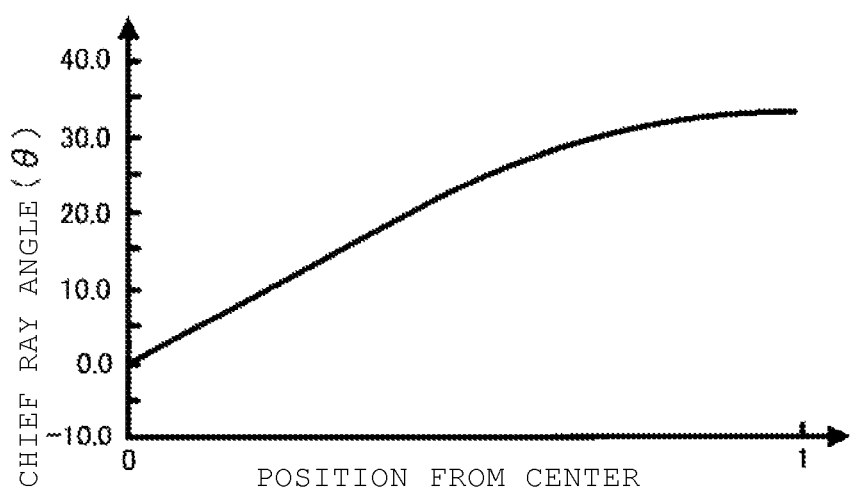
FIG. 3 is a lens characteristic diagram showing a relationship between the positions of pixels of the solid-state image sensing device whose light receiving surface is horizontal and chief ray angles θ, to the pixels, of the light incident on the lens whose surface is convexly curved.

FIG. 3 is a lens characteristic diagram showing a relationship between the positions of the pixels 114a of the solid-state image sensing device 114 whose light receiving surface 114S is horizontal and the chief ray angles θ, to the pixels 114a, of light incident on the lens 15 whose surface 15S is convexly curved. In FIG. 3, the horizontal axis shows the positions of the pixels 114a, and the vertical axis shows the chief ray angles θ to the pixels 114a.

As shown in FIG. 3, when light is transmitted into the solid-state image sensing device 114 having the horizontal light receiving surface 114S by using the lens 15 whose surface 15S is convexly curved, the pixel 114ao in the central portion receives light at the chief ray angle θ=0°, but a pixel 114a, of the pixels 114a excluding the pixel 114ao in the central portion, disposed in a position farther from the pixel 114ao in the central portion (that is, disposed in a position closer to the pixel 114ae in the extreme end portion) receives light at a larger chief ray angle θ.

As shown in FIGS. 2 and 3, when the pixels 114a of the solid-state image sensing device 114 receive light, the pixel 114ao in the central portion receives the largest amount of light, and the pixel 114a disposed in a position farther from the pixel 114ao in the central portion (that is, disposed in a position closer to the pixel 114ae in the extreme end portion) receives a smaller amount of light. Consequently, the pixel 114a disposed in a position closer to the pixel 114ae in the extreme end portion has decreased sensitivity. In this way, in the solid-state image sensing device 114, whose light receiving surface 114S is horizontal, sensitivity varies for each pixel 114a, and the pixels 114a are non-uniform in sensitivity.

To solve this problem, in the camera module 10 shown in FIG. 1, the light receiving surface 14S of the solid-state image sensing device 14 is curved so that the chief ray angles θ of light incident on all the pixels 14a are substantially equal to each other. Consequently, the variation insensitivity for each pixel 14a is improved.

The light receiving surface 14S of the solid-state image sensing device 14 is curved into a desired shape by designing the curved shape of the front surface of the spacer 12 based on, for example, the lens characteristic diagram shown in FIG. 3, thus manufacturing the spacer 12, and disposing the solid-state image sensing device 14 on the spacer 12 manufactured in this way.

In particular, in the camera module 10 according to the embodiment, the light receiving surface 14S of the solid-state image sensing device 14 is curved such that the chief ray angles θ of light incident on all the pixels 14a are substantially θ=0° (i.e., normal to each pixel). Consequently, it is not only that the variation in sensitivity for every pixel 14a is improved, but the sensitivity of the pixels 14a is improved in particularly other positions than the central portion.

As heretofore described, in the camera module 10 according to the embodiment, the light receiving surface 14S of the solid-state image sensing device 14 is curved such that the chief ray angles θ of light incident on all the pixels 14a are equal to each other. Consequently, it is possible to improve the variation in sensitivity for every pixel 14a.

Furthermore, in the camera module 10 according to the embodiment, the light receiving surface 14S of the solid-state image sensing device 14 is curved such that the chief ray angles θ of light incident on all the pixels 14a are substantially θ=0° (i.e., normal to the pixel). Consequently, not only is it possible to improve the variation in sensitivity for every pixel 14a, it is also possible to improve the sensitivity of the pixels 14a particularly other than in the central portion.

In the heretofore described embodiment, a description has been given of a case of employing the lens 15 whose surface 15S is convexly curved, but with the camera module 10 according to the embodiment, it is possible to improve the variation in sensitivity for every pixel 14a by curving the light receiving surface 14S of the solid-state image sensing device 14 in accordance with the shape of the surface of the other lenses such that the chief ray angles θ of light incident on all the pixels 14a are equal to each other.

Figure 4:
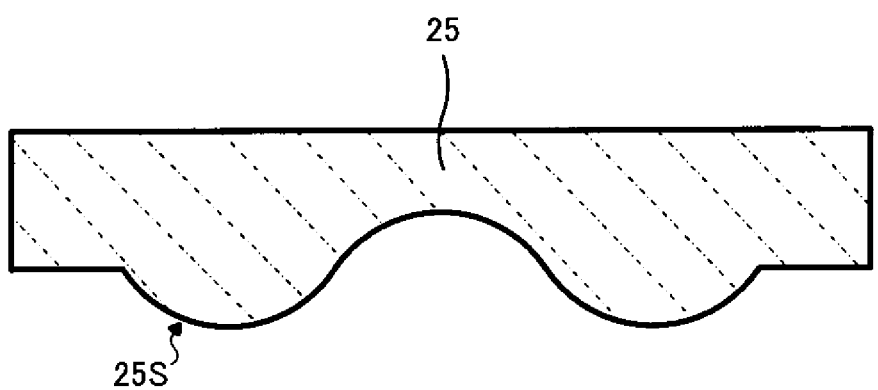
FIG. 4 is a diagram depicting an example of another type of lens.

FIG. 4 is a diagram schematically showing one example of other lenses. A lens 25 shown in FIG. 4 is a so-called seagull lens, which has a plurality of convex portions on a surface 25S opposite to the light receiving surface 14S of the solid-state image sensing device 14. The lens 25 corrects field curvature caused by the lens 15 shown in FIG. 1.

Figure 5:
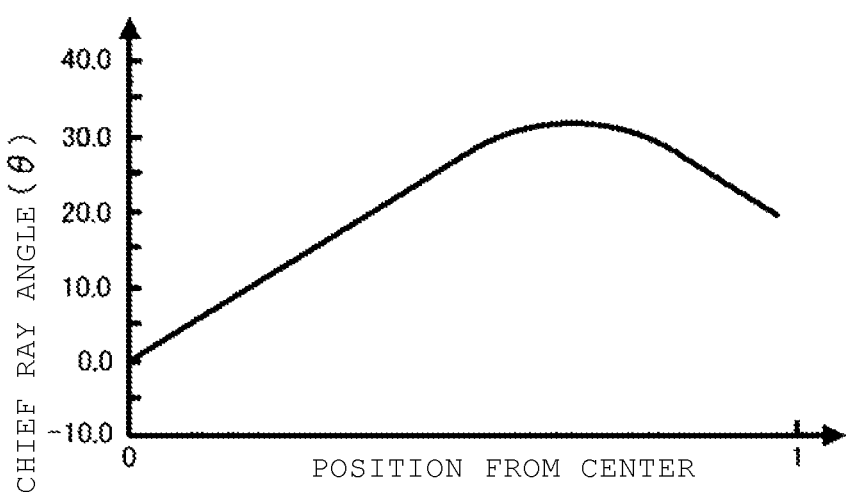
FIG. 5 is a lens characteristic diagram showing a relationship between the positions of pixels of the solid-state image sensing device whose light receiving surface is horizontal and chief ray angles θ, to the pixels, of light incident on the lens shown in FIG. 4.

FIG. 5 is a lens characteristic diagram showing a relationship between the positions of the pixels 114a of the solid-state image sensing device 114 whose light receiving surface 114S is horizontal and the chief ray angles θ to the pixels 114a of light incident from the so-called seagull lens 25. Also, in FIG.

5, in the same way, the horizontal axis shows the positions of the pixels 114a, and the vertical axis shows the chief ray angles θ to the pixels 114a.

As shown in FIG. 5, when the seagull lens 25 is employed, the pixel 114ao in the central portion (the pixel disposed in the position "0") receives light at the chief ray angle θ=0°, and the pixels 114a, including the pixel 114ae in the extreme end portion and excluding the pixel 114ao in the central portion, receive light at the chief ray angles θ≠0°. This point is the same as when the lens 15 whose surface 15S is convexly curved is employed, but is different in that each pixel 114a receives light so that a predetermined pixel 114a disposed between the pixel 114ao in the central portion and the pixel 114ae in the extreme end portion (the pixel disposed in the position "1") has a largest chief ray angle θ. That is, when the seagull lens 25 is employed, the chief ray angle θ to each pixel increases as the positions of the pixels are from the center toward the outer side in a region from the pixel 114ao in the central portion outward to the pixel 114a disposed in the predetermined position. However, in the region from the pixel disposed in the predetermined position to the pixel 114ae in the extreme end portion, the chief ray angle θ to each pixel decreases as the positions of the pixels are from the pixel disposed in the predetermined position toward the outer side.

Even when the lens 25 having these types of characteristics is employed, it is possible to improve the variation in sensitivity for every pixel 14a by curving the light receiving surface 14S of the solid-state image sensing device 14 such that the chief ray angles θ of light incident on all the pixels 14a are equal to each other, as described in the heretofore described embodiment.

The light receiving surface 14S of the solid-state image sensing device 14 in this case is curved into a desired shape, in the same way, i.e., by designing the curved shape of the front surface of the spacer 12 based on, for example, the lens characteristic diagram shown in FIG. 5, thus manufacturing the spacer 12, and disposing the solid-state image sensing device 14 on the spacer 12 manufactured in this way.

Furthermore, even when the characteristic lens 25 is employed, not only it is possible to improve the variation in sensitivity for every pixel 14a by curving the light receiving surface 14S of the solid-state image sensing device 14 so that the chief ray angles θ of light incident on all the pixels 14a are substantially θ=0° (i.e., normal to the pixel), it is also possible to improve the sensitivity of the pixels 14a particularly other than in the central portion.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the embodiment, the lens 15, 25 is disposed in the lens barrel 19 disposed in the lens holder 17. However, it is sufficient to dispose the lens 15, 25 in the lens holder so as to be disposed at least above the light receiving surface 14S of the solid-state image sensing device 14, or may be, for example, fixed directly in the lens holder.

What is claimed is:

1. A camera module comprising:
a first substrate;
a solid-state image sensing device having a light receiving surface on which a plurality of pixels is provided;
a lens disposed above the solid-state image sensing device and configured to direct light into each of the pixels of the solid-state image sensing device;
a spacer disposed on the first substrate, the spacer having a front surface that is curved corresponding to a configuration of the lens; and
a second substrate disposed so that an entire rear surface of the second substrate is in contact with the front surface of the spacer, the second substrate having a front surface supporting the solid-state image sensing device, wherein
the lens includes at least one convex portion on a surface facing the light receiving surface of the solid-state image sensing device, and
the light receiving surface of the solid-state image sensing device is curved so that chief rays of the light directed by the lens are incident on each respective pixel in the plurality of pixels at substantially the same angle for each respective pixel.

2. The camera module according to claim 1, wherein the chief rays of light are incident on each respective pixel at an angle normal to the light receiving surface above the respective pixel.

3. The camera module according to claim 1, wherein
the solid-state image sensing device and the second substrate are electrically connected together, and
the second substrate and the first substrate are electrically connected by wires so that a signal output from the solid-state image sensing device is transmitted to the first substrate via the second substrate and the wires.

4. The camera module according to claim 1, further comprising a lens holder disposed on a front surface of the first substrate to cover the spacer, the second substrate, and the solid-state image sensing device, and configured to hold the lens at a predetermined distance above the solid-state image sensing device.

5. The camera module according to claim 4, wherein the lens holder is cylindrical and formed from a light-shielding resin.

6. The camera module according to claim 4, further comprising an infrared blocking filter held by the lens holder between the lens and the solid-state image sensing device.

7. The camera module according to claim 4, wherein
the lens holder includes a larger diameter portion and a smaller diameter portion in which a cylindrical lens barrel is disposed, and
the cylindrical lens barrel holds the lens and permits the distance between the lens and the solid-state image sensing device to be adjusted.

8. The camera module according to claim 7, wherein the smaller diameter portion of the lens holder includes threaded ridges and an output peripheral surface of the lens barrel includes thread grooves so that the distance between the lens and the solid-state image sensing device is adjusted by turning the lens barrel.

9. A camera module comprising:
a first substrate;
a solid-state image sensing device having a light receiving surface on which a plurality of pixels is provided;
a lens disposed above the solid-state image sensing device and configured to direct light into each of the pixels of the solid-state image sensing device;

a spacer disposed on the first substrate, the spacer having a front surface that is curved corresponding to a configuration of the lens; and a second substrate disposed so that the entire rear surface of the second substrate is in contact with the front surface of the spacer, the second substrate having a front surface supporting the solid-state image sensing device, wherein the lens is a seagull type of lens, and the light receiving surface of the solid-state image sensing device is curved so that chief rays of the light directed by the lens are incident on each respective pixel in the plurality of pixels at substantially the same angle for each respective pixel.

10. The camera module according to claim 9, wherein the chief rays of light are incident on each respective pixel at an angle normal to the light receiving surface above the respective pixel.

11. The camera module according to claim 9, wherein the solid-state image sensing device and the second substrate are electrically connected together, and the second substrate and the first substrate are electrically connected by wires so that a signal output from the solid-state image sensing device is transmitted to the first substrate via the second substrate and the wires.

12. The camera module according to claim 9, further comprising a lens holder disposed on a front surface of the first substrate to cover the spacer, the second substrate, and the solid-state image sensing device, and configured to hold the lens a distance above the solid-state image sensing device.

13. The camera module according to claim 12, wherein the lens holder is cylindrical and formed from a light-shielding resin.

14. The camera module according to claim 12, further comprising an infrared blocking filter held by the lens holder between the lens and the solid-state image sensing device.

15. The camera module according to claim 12, wherein the lens holder includes a larger diameter portion and a smaller diameter portion in which a cylindrical lens barrel is disposed, and the cylindrical lens barrel holds the lens and permits the distance between the lens and the solid-state image sensing device to be adjusted.

16. The camera module according to claim 15, wherein the smaller diameter portion of the lens holder includes threaded ridges and an output peripheral surface of the lens barrel includes thread grooves so that the distance between the lens and the solid-state image sensing device is adjusted by turning the lens barrel.

17. A camera module comprising:

a first substrate;

a spacer disposed on the first substrate and having a curved front surface;

a second substrate disposed so that the entire rear surface of the second substrate is in contact with the curved front surface of the spacer, wherein the second substrate conforms to the curvature of the curved front surface of the spacer;

a solid-state image sensing device disposed on a front surface of the second substrate and having a light receiving surface on which a plurality of pixels are provided, wherein the light receiving surface conforms to the curvature of second substrate;

a lens disposed above the solid-state image sensing device and configured to direct light into each of the pixels of the solid-state image sensing device so that chief rays of the light directed by the lens are incident on the respective pixels at substantially the same angles, wherein the lens includes a plurality of convex portions on a surface facing the light receiving surface of the solid-state image sensing device, and the lens has a characteristic diagram to which the curvature of the curved front surface of the spacer corresponds;

a lens holder configured to hold the lens and disposed on a front surface of the first substrate so as to cover the spacer, the second substrate, and the solid-state image sensing device; and an infrared blocking filter held by the lens holder between the lens and the solid-state image sensing device.

18. The camera module according to claim 17, wherein the lens holder includes a larger diameter portion and a smaller diameter portion in which a cylindrical lens barrel is disposed, and the cylindrical lens barrel holds the lens and permits the distance between the lens and the solid-state image sensing device to be adjusted.

* * * * *